United States Patent
Lu

(10) Patent No.: US 11,349,003 B2
(45) Date of Patent: May 31, 2022

(54) TRANSISTOR STRUCTURE WITH A STRESS LAYER

(71) Applicant: Cambridge Electronics, Inc., Belmont, MA (US)

(72) Inventor: Bin Lu, Watertown, MA (US)

(73) Assignee: Cambridge Electronics, Inc., Belmont, MA (US)

( * ) Notice: Subject to any disclaimer, the term of this patent is extended or adjusted under 35 U.S.C. 154(b) by 167 days.

(21) Appl. No.: 15/931,744

(22) Filed: May 14, 2020

(65) Prior Publication Data

US 2020/0365394 A1 Nov. 19, 2020

Related U.S. Application Data

(60) Provisional application No. 62/848,353, filed on May 15, 2019.

(51) Int. Cl.
*H01L 29/423* (2006.01)
*H01L 21/02* (2006.01)
(Continued)

(52) U.S. Cl.
CPC ...... *H01L 29/4236* (2013.01); *H01L 21/0254* (2013.01); *H01L 21/108* (2013.01);
(Continued)

(58) Field of Classification Search
CPC ............. H01L 29/7813; H01L 29/7825; H01L 29/66613–66628; H01L 29/42352; H01L 29/4236; H01L 29/2003; H01L 29/66431; H01L 29/66462; H01L 29/778–7789; H01L 2924/13064; H01L 2924/13084–13085; H01L 2924/13092; H01L 29/7831–7832; H01L 29/66484;
(Continued)

(56) References Cited

U.S. PATENT DOCUMENTS 5,530,272 A * 6/1996 Kudo ..................... B82Y 10/00
257/192
9,041,003 B2 5/2015 Palacios et al.
(Continued)

FOREIGN PATENT DOCUMENTS

CN 105247680 A * 1/2016 .......... H01L 29/417
CN 106981514 A * 7/2017
(Continued)

OTHER PUBLICATIONS

Chong Wang et al (Characteristics and threshold voltage model of GaN-based FinFET with recessed gate) 2018 Chinese Phys. B 27 097308 (Year: 2018).*
(Continued)

*Primary Examiner* — Scott B Geyer
(74) *Attorney, Agent, or Firm* — Nields, Lemack & Frame, LLC

(57) ABSTRACT

A new transistor structure is disclosed. This new structure has a dielectric stress layer in a three-dimensional structure outside of the gate region for modulation or the characteristics of the transistor. Additionally, trenches are created in the region between the source electrode and the drain electrode in such a manner so as to create ridges that traverse the gate region.

12 Claims, 7 Drawing Sheets

(51) Int. Cl.
*H01L 29/78* (2006.01)
*H01L 21/108* (2006.01)
*H01L 29/20* (2006.01)
*H01L 29/778* (2006.01)
*H01L 29/66* (2006.01)

(52) U.S. Cl.
CPC .... *H01L 29/2003* (2013.01); *H01L 29/66462* (2013.01); *H01L 29/66484* (2013.01); *H01L 29/7786* (2013.01); *H01L 29/7813* (2013.01); *H01L 29/7831* (2013.01)

(58) Field of Classification Search
CPC .. H01L 21/823437–823456; H01L 21/823842
See application file for complete search history.

(56) References Cited

U.S. PATENT DOCUMENTS

| | | | |
|---|---|---|---|
| 9,368,622 B1* | 6/2016 | Boutros | H01L 29/778 |
| 10,325,982 B1* | 6/2019 | Chang | H01L 29/0634 |
| 10,566,192 B2 | 2/2020 | Lu et al. | |
| 2007/0114567 A1* | 5/2007 | Matocha | H01L 29/7787 |
| | | | 257/192 |
| 2012/0146097 A1* | 6/2012 | Endo | H01L 29/7839 |
| | | | 257/194 |
| 2014/0094223 A1* | 4/2014 | Dasgupta | H01L 29/66431 |
| | | | 455/566 |
| 2016/0284831 A1* | 9/2016 | Shindome | H01L 29/7786 |
| 2019/0288101 A1* | 9/2019 | Longobardi | H01L 29/4236 |

FOREIGN PATENT DOCUMENTS

| | | | | |
|---|---|---|---|---|
| CN | 109817712 A | * | 5/2019 | |
| WO | WO-2018095931 A2 | * | 5/2018 | ......... H01L 29/2003 |

OTHER PUBLICATIONS

Sameer Joglekar et al. (Large Signal Linearity Enhancement of AlGaN/GaN High Electron Mobility Transistors by Device-level VT Engineering for Transconductance Compensation) 2017, 2017 IEEE International Electron Devices Meeting (IEDM) (Year: 2018).*

Bin Lu et al. (Tri-Gate Normally-Off GaN Power MISFET), IEEE Electron Device Letters, vol. 33, No. 3, Mar. 2012 (Year: 2012).*

* cited by examiner

TRANSISTOR STRUCTURE WITH A STRESS LAYER

This application claims priority of U.S. Provisional Patent Application Ser. No. 62/848,353, filed May 15, 2019, the disclosure of which is incorporated herein in its entirety.

FIELD

Embodiments of the present disclosure relate to transistor structures and methods for forming these transistor structures.

BACKGROUND

Compared with conventional power devices made of silicon, Group III-Nitride (III-N) semiconductors possess excellent electronic properties that enable the fabrication of modern power electronic devices and structures for use in a variety of applications. The limited critical electric field and relatively high resistance of silicon make currently available commercial power devices, circuits and systems constrained with respect to operating frequencies. On the other hand, the higher critical electric field and higher electron density and mobility of III-N materials allow high-current, high-voltage, high-power and/or high-frequency performance of improved power transistors. These attributes are desirable in advanced transportation systems, high-efficiency electricity generation and conversion systems, and energy delivery networks. Such systems rely on efficient power converters to modify electric voltages, and use power transistors capable of blocking large voltages and/or carrying large currents. For example, power transistors with blocking voltages of more than 500V are used in hybrid vehicles to convert DC power from the batteries to AC power. Some other exemplary applications of power transistors include power supplies, automotive electronics, automated factory equipment, motor controls, traction motor drives, high voltage direct current (HVDC) electronics, lamp ballasts, telecommunication circuits and display drives.

Conventional III-nitride semiconductor transistors have planar structures. Due to the polarization property of III-nitride semiconductors, two-dimensional-electron-gas (2DEG) is formed at the AlGaN/GaN heterojunction interface.

It would be beneficial if there were a transistor structure that included a stress layer outside the gate recess region to allow modulation of the characteristics of the transistor.

SUMMARY

A new transistor structure is disclosed. This new structure has a dielectric stress layer in a three-dimensional structure outside of the gate recess region for modulation or the characteristics of the transistor. Additionally, trenches are created in the region between the source electrode and the drain electrode in such a manner so as to create ridges that traverse the gate recess region.

According to one embodiment, a semiconductor structure for use in a III-Nitride (III-N) semiconductor device is disclosed. The semiconductor structure comprises a semiconductor layer comprising a first III-N material for providing electrical conduction; a barrier layer comprising a second III-N material; a source electrode and a drain electrode disposed in ohmic recesses in contact with the barrier layer; a trench region defined between the source electrode and the drain electrode, wherein trenches are etched into portions of the barrier layer between the source electrode and the drain electrode, wherein ridges are created between the trenches, wherein the ridges comprise the semiconductor layer and the barrier layer and extend from an area near the source electrode to an area near the drain electrode and traverse the trench region; a gate recess region defined in the trench region, wherein the gate recess region is narrower than the trench region such that the trenches are disposed on both sides of the gate recess region; a dielectric layer, wherein the dielectric layer fills at least a portion of the trenches and covers the barrier layer outside the gate recess region, and wherein a thickness of the dielectric layer in the gate recess region is less than in other areas; and a gate electrode disposed in the gate recess region, wherein the gate electrode is formed over the ridges. In certain embodiments, the dielectric layer has compressive or tensile stress. In some embodiments, the dielectric layer comprises a plurality of sublayers, wherein at least one of the sublayers has compressive or tensile stress. In some embodiments, a magnitude of the compressive or tensile stress is greater than 10 MPascal. In certain embodiments, the dielectric layer is selected from $Si_xN_y$, $SiO_2$, $SiO_xN_y$, $Al_2O_3$, and AlN. In some embodiments, the dielectric layer fills an entirety of the trenches between the ridges outside of the gate recess region. In some embodiments, the dielectric layer is absent in the gate recess region. In some embodiments, the gate electrode fills the gate recess region and an upper portion of the gate electrode is wider than the gate recess region. In some further embodiments, the upper portion of the gate electrode is narrower than the trench region. In certain embodiments, a gate dielectric material is disposed beneath the gate electrode. In some embodiments, a depth of the trenches is greater than a thickness of the barrier layer such that the trench extends into the semiconductor layer. In other embodiments, a depth of the trenches is less than a thickness of the barrier layer such that the trench does not extend into the semiconductor layer.

According to another embodiment, a method of manufacturing a semiconductor structure is disclosed. The method comprises providing a wafer having a substrate, a semiconductor layer disposed on the substrate and a barrier layer disposed on the semiconductor layer; etching the barrier layer to form trenches, wherein ridges are created between adjacent trenches, the ridges traversing a gate region of the semiconductor structure; depositing a dielectric layer over the wafer after the etching; removing at least a portion of the dielectric layer in the gate region to form a gate recess region; forming a gate electrode in the gate recess region after removing at least a portion of the dielectric layer; creating ohmic recesses on both sides of the gate region; and forming a source electrode and a drain electrode in the ohmic recesses. In certain embodiments, the dielectric layer has compressive or tensile stress.

According to another embodiment, a semiconductor structure for use in a III-Nitride (III-N) semiconductor device is disclosed. The semiconductor structure comprises a semiconductor layer comprising a first III-N material for providing electrical conduction; a barrier layer comprising a second III-N material; a source electrode and a drain electrode disposed in ohmic recesses in contact with the barrier layer; a trench region defined between the source electrode and the drain electrode, wherein trenches are etched into portions of the barrier layer between the source electrode and the drain electrode, wherein ridges are created between the trenches, wherein the ridges comprise the semiconductor layer and the barrier layer and extend from an area near the source electrode to an area near the drain electrode and traverse the trench region; a plate recess region defined in the trench region, wherein the plate recess region is narrower than the trench region such that the trenches are disposed on both sides of the plate recess region; a dielectric layer, wherein the dielectric layer fills at least a portion of the trenches and covers the barrier layer outside the plate recess region, and wherein a thickness of the dielectric layer in the plate recess region is less than in other areas; a field plate disposed in the plate recess region, wherein the field plate is formed over the ridges; and a gate electrode disposed in a recess in the barrier layer between the field plate and the source electrode. In certain embodiments, the dielectric layer has compressive or tensile stress. In some embodiments, the dielectric layer comprises a plurality of sublayers, wherein at least one of the sublayers has compressive or tensile stress. In some embodiments, a magnitude of the compressive or tensile stress is greater than 10 MPascal. In certain embodiments, a gate dielectric material is disposed beneath the gate electrode. In certain embodiments, a dielectric material is disposed beneath the field plate.

BRIEF DESCRIPTION OF THE FIGURES

For a better understanding of the present disclosure, reference is made to the accompanying drawings, which are incorporated herein by reference and in which.

DETAILED DESCRIPTION

Embodiments of the present disclosure relate to multi-layer semiconductor structures and methods for fabricating these structures. The multi-layer semiconductor structures have recessed gate regions and ohmic regions, and a dielectric stress layer. The semiconductor structures described herein may be formed of compound semiconductor materials, such as III-V semiconductor materials, and particularly Group III-Nitride (III-N) semiconductor materials.

Figure 1A:
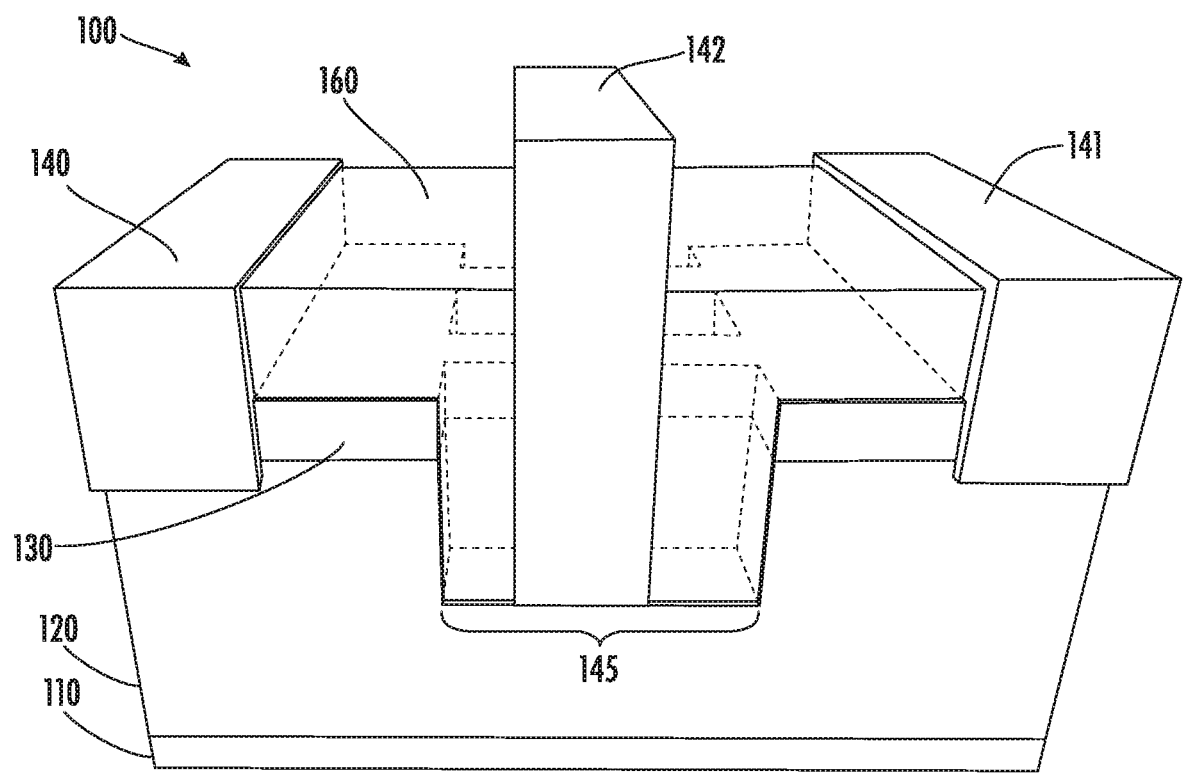
FIG. 1A is a side view of a transistor structure according to one embodiment.
Figure 1B:
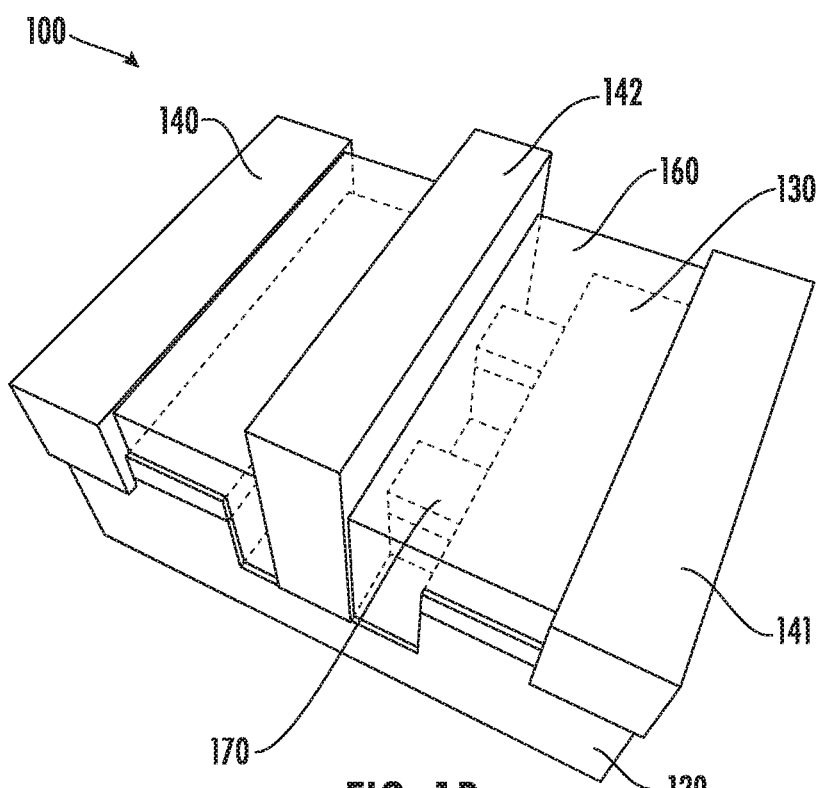
FIG. 1B is a perspective view of the transistor structure of FIG. 1A.
Figure 1C:
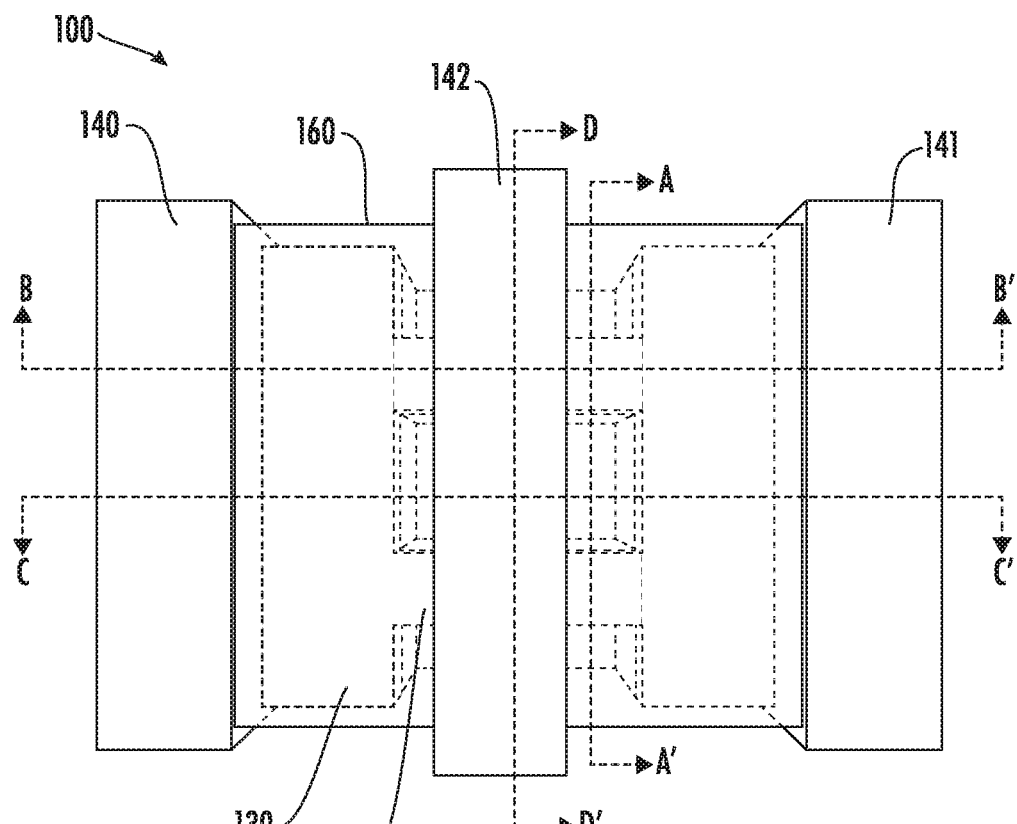
FIG. 1C is a top view of the transistor structure of FIG. 1A.
Figure 1D:
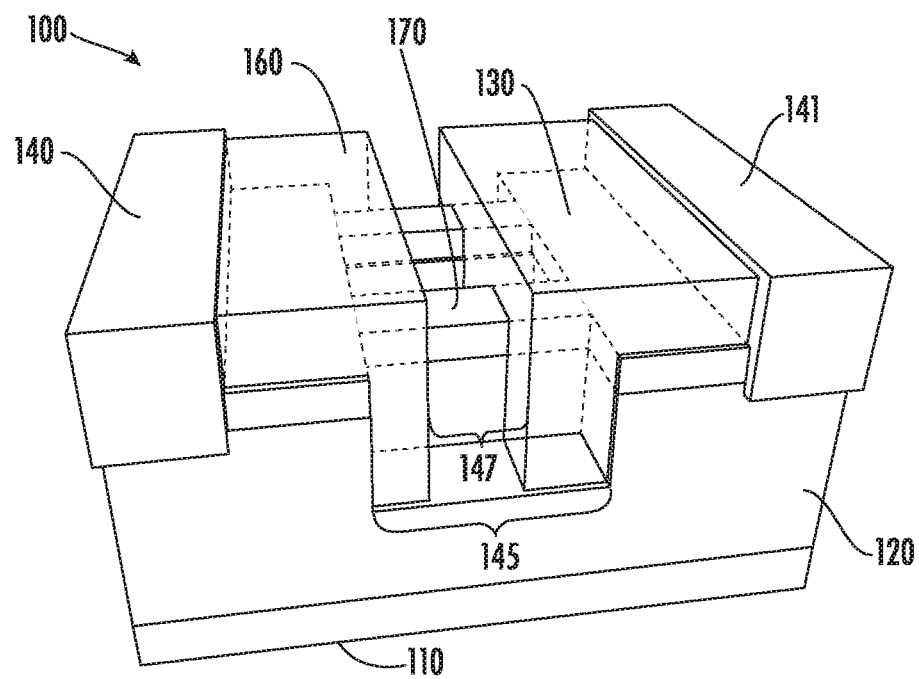
FIG. 1D is a perspective view of the transistor structure of FIG. 1A with the gate electrode removed for clarity.

FIG. 1A shows a side view of a semiconductor structure 100 according to one embodiment. FIG. 1B is a perspective view of the semiconductor structure 100. FIG. 1C is a top view of the semiconductor structure 100. FIG. 1D is a perspective view of the semiconductor structure 100 with the gate electrode removed for clarity. This semiconductor structure 100 may be a transistor.

Figure 6:
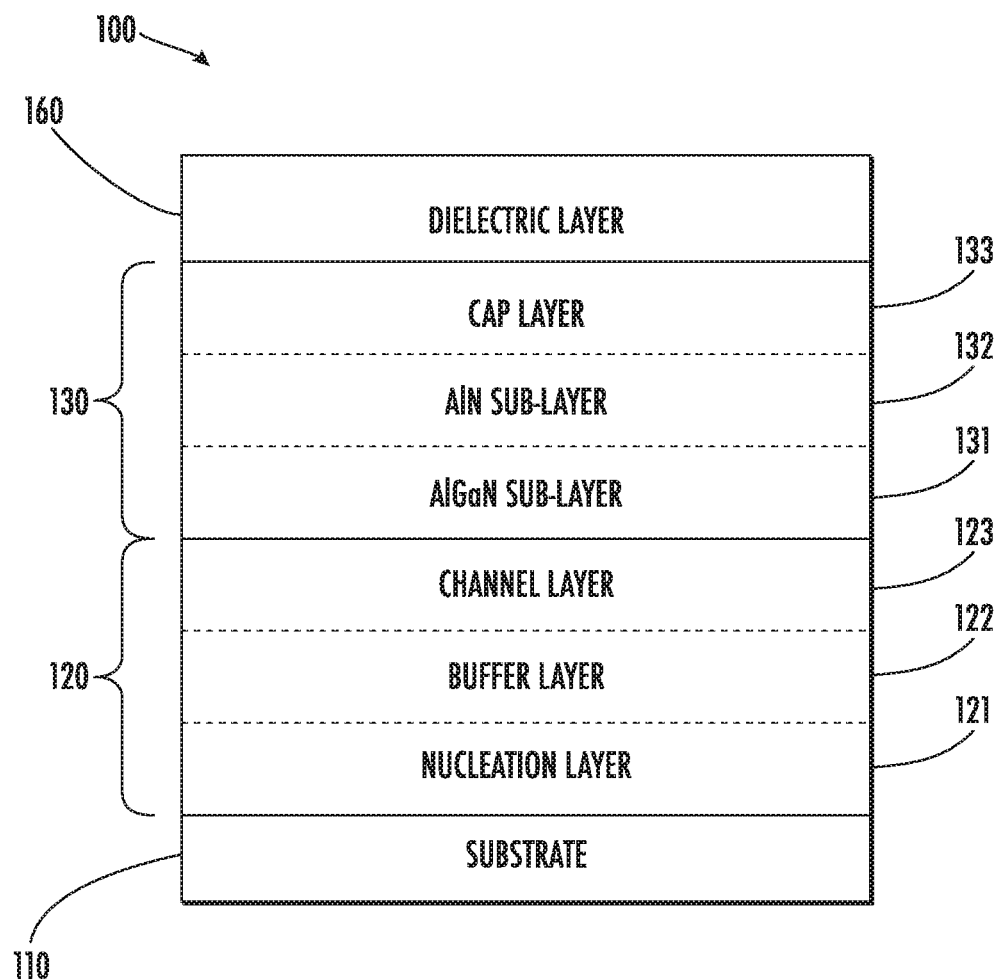
FIG. 6 shows a cross-sectional view of the layers in the semiconductor structure.

As shown in FIG. 6, the semiconductor structure 100 includes a semiconductor layer 120. The semiconductor layer 120 may be formed on a substrate 110, wherein the substrate 110 is suitable for III-Nitride semiconductor epitaxial growth. The substrate 110 may include a group IV, III-V, or II-VI semiconductor material such as silicon, germanium, or ZnO for example. Other typical substrates include SiC, Sapphire, Si, and bulk GaN.

The semiconductor layer 120 formed over the substrate 110 may include a compound semiconductor material, such as a III-V semiconductor material (e.g., a III-N material).

As shown in FIG. 6, the semiconductor layer 120 may have multiple sub-layers, such as a channel layer 123, a buffer layer 122 and a nucleation layer 121 disposed on the substrate 110. The thickness of the channel layer 123 may be 5 nm, although other thicknesses may be used. The thickness of the buffer layer 122 may be between zero and a few microns, although other thicknesses are within the scope of the disclosure.

More specifically, in some embodiments, the semiconductor layer 120 may include a buffer layer 122, which is disposed proximate the substrate 110 to accommodate a difference in lattice constant. Suitable techniques for accommodating a lattice mismatch between the substrate 110 and a semiconductor material of a different lattice constant using a buffer layer 122 are understood by those of ordinary skill in the art, and will not be detailed herein. In some embodiments, a substrate having a suitable lattice constant for the formation of overlying compound semiconductor material(s) may be used, and buffer layer 122 may be omitted. For example, the substrate 110 may be a GaN substrate, a ZnO substrate or another substrate of a material with a lattice constant similar to that of a compound semiconductor material to be formed thereon. The techniques described herein are not limited as to substrate 110 or buffer layer. In addition, in some embodiments, the semiconductor layer 120 may include a nucleation layer 121, which may be disposed between the substrate 110 and the buffer layer 122. In certain embodiments, the buffer layer 122 may include the nucleation layer or a nucleation region at the interface with substrate 110.

A barrier layer 130 is formed over the semiconductor layer 120. The barrier layer 130 may have a thickness between 0.5 nm and several hundred nm. The barrier layer 130 is in contact with the semiconductor layer 120 and has a conduction band offset with the semiconductor layer 120. As shown in FIG. 6, the barrier layer 130 may have multiple sub-layers, including an etch-stop layer or a cap layer 133. The barrier layer 130 is made of material selected from III-nitride semiconductors such as AlGaN, InAlN, AlN, GaN, or other semiconductor materials, or from dielectric materials such as $Si_xN_y$, $SiO_2$, $Al_2O_3$, $SiO_xN_y$ or a combination of semiconductor and dielectric materials. In one embodiment, the barrier layer 130 has an AlGaN sub-layer 131 in contact with semiconductor layer 120, an AlN sub-layer 132 over the AlGaN sub-layer 131 and a cap layer 133 over the AlN sub-layer, where the cap layer is a Si-doped GaN layer, a Mg-doped GaN layer or a $Si_xN_y$ layer. In another embodiment, the barrier layer 130 has an AlGaN sub-layer 131 in contact with semiconductor layer 120, and a cap layer 133 over the AlGaN sub-layer 131, where the cap layer is a Si-doped GaN layer, a Mg-doped GaN layer or a $Si_xN_y$ layer. A conductive channel having electrons or holes is formed in the semiconductor layer 120 or at the interface between the barrier layer 130 and the semiconductor layer 120.

A dielectric layer 160 is disposed on top of the barrier layer 130 after the trenches have been created. The dielectric layer 160 may have a thickness over 10 nm. In certain embodiments, the dielectric layer 160 has compressive or tensile stress. In certain embodiments, the dielectric layer 160 may have multiple sub-layers wherein one or more of the sub-layers have compressive or tensile stress. The magnitude of the stress may be in excess of 10 MPascal. In certain embodiments, a subset of the sub-layers may not have any stress. The dielectric layer 160 may be formed by low pressure chemical vapor deposition (LPCVD), plasma-enhanced chemical vapor deposition (PECVD), physical vapor deposition or any other suitable methods. The dielectric layer 160 can also be formed by oxidation of deposited material such as poly-Silicon. The dielectric layer 160 is made of material selected from $Si_xN_y$, $SiO_2$, $SiO_xN_y$, $Al_2O_3$, AlN and any other suitable material.

Returning to FIG. 1A, the source electrode 140 and drain electrode 141 may be made of material selected from titanium, aluminum, titanium nitride, tungsten, tungsten nitride, nickel, gold, molybdenum, and any other suitable conductive material or combination of conductive materials. The source electrode 140 and drain electrode 141 form ohmic contacts to semiconductor layer 120. In certain embodiments, the dielectric layer 160 is at least partially absent from the bottom of the source electrode 140 and drain electrode 141 such that at least a portion of the source electrode 140 and the drain electrode 141 directly contacts the barrier layer 130. In one example, the entirety of the bottom of the source electrode 140 and drain electrode 141 are in contact with the barrier layer 130. In another embodiment, at least a portion of the bottom of the source electrode 140 and drain electrode 141 are disposed in recessed regions in the barrier layer 130. The depth of these recessed regions in the barrier layer 130 underneath the source electrode 140 and drain electrode 141 may be thinner or larger than the thickness of the barrier layer 130. Thus, in certain embodiments, the source electrode 140 and drain electrode 141 contact the semiconductor layer 120. It is also possible to have source electrode 140 and drain electrode 141 overhang on top of the dielectric layer 160 such that the top portions of the source electrode 140 and the drain electrode 141 are larger than the opening in the dielectric layer 160 in which the bottoms of the electrodes are disposed. These electrodes make electrical connection with the semiconductor layer 120, so that electrical current may flow laterally between the source electrode 140 and the drain electrode 141 via the semiconductor layer 120.

A plurality of trenches are formed between the source electrode 140 and drain electrode 141. The trenches are formed by etching into the barrier layer 130 and optionally the semiconductor layer 120. In FIGS. 1A-1D, the entire barrier layer 130 and a top portion of the semiconductor layer 120 are removed in the trenches.

In another embodiment, the trenches are formed in the barrier layer 130 without completely removing the barrier layer 130 in the trenches. In other words, the depth of the trenches may be more or less than the thickness of the barrier layer 120. The depth of the trenches may be more than 5 nm. The area between the source electrode 140 and the drain electrode 141 that comprises the trenches may be referred to as the trench region 145.

Disposed between the trenches are ridges 170 connecting the source and the drain areas. In other words, the ridges 170 comprise barrier layer 130 and semiconductor layer 120 and may extend from the area proximate the source electrode 140 to the area proximate the drain electrode 141 through the trench region 145. Thus, ridges 170 are regions between the source area and the drain area where the barrier layer 130 and the semiconductor layer 120 are not etched. The source area is defined as that portion of the semiconductor structure 100 that is proximate the source electrode 140 and the portion disposed under the source electrode 140. Similarly, the drain area is defined as that portion of the semiconductor structure 100 that is proximate the drain electrode 141 and the portion disposed under the drain electrode 141.

The trenches have sidewalls. The sidewalls of the trench correspond to the sidewalls of the adjacent ridges. Additionally, the end walls of the trench may correspond to end walls of the source area and the drain area. In other words, each trench may be bounded by ridges on one or two sides, the source area on one end and the drain area on the opposite end.

In FIGS. 1A-1D and 2A-2D, the portion of the trench region 145 where the gate electrode 142 is disposed may be referred to as the gate region. The gate region is disposed between the source electrode 140 and the drain electrode 141. The portion of the gate region where the dielectric layer 160 is etched to form a recess where the gate electrode 142 is disposed is referred to as the gate recess region 147 (see FIG. 1D). Thus, the ridges 170 extend from the source area to the drain area, traversing the trench region 145 and the gate recess region 147. The gate recess region 147 may be narrower than the trench region 145 such that there are trenches on both sides of the gate recess region 147.

Although FIGS. 1A-1D show only two ridges 170, the disclosure is not limited to this embodiment, and an arbitrary number of ridges 170 may be included. In certain embodiments, the ridges 170 may be in parallel to one another. The direction of the ridges 170 from the source area to the drain area may or may not be aligned to the crystalline direction of the semiconductor layer 120, for example the [1120] crystalline direction of wurtzite GaN crystal. The direction of the ridges 170 from the source area to the drain area may or may not form a 90 degree angle with respect to the source electrode 140 and the drain electrode 141.

In FIGS. 1A-1D, the source area and the drain area both include a region having a barrier layer 130 and a semiconductor layer 120. However, in certain embodiments, the trenches and ridges 170 may extend to the source electrode 140 and/or drain electrode 141. In other words, the trench region 145 may extend to the source electrode 140 and/or the drain electrode 141. In this embodiment, the source area only comprises the barrier layer 130 and semiconductor layer 120 under the source electrode 140, while the drain area only comprises the barrier layer 130 and semiconductor layer 120 under the drain electrode 141.

In other embodiments, the trenches and ridges may extend to and underneath a portion of the source electrode 140 and/or the drain electrode 141.

Further, the trench region 145 does not need to be continuous. For example, the trench may be beneath the gate electrode 142 in the gate recess region 147 and also proximate the source area and/or drain area, but may be absent in a space between the gate recess region 147 and the source area and the drain area.

The width of the ridges 170 may be more than 1 nm. The width of the ridges 170 and the trenches may or may not be uniform in the semiconductor structure 100. In one embodiment, the width of the trenches or ridges 170 varies from one part of semiconductor structure 100 to another part. In another embodiment, a plurality of transistor structures with different width of trenches or ridges 170 are connected together in a subsystem.

Dielectric layer 160 is formed over the region between the source electrode 140 and the drain electrode 141. Specifically, the dielectric layer 160 is formed over the trench region 145 and covers at least a portion of the trench sidewalls. In the source and drain areas, the dielectric layer 160 is disposed on the barrier layer 130. As shown in FIG. 1D, dielectric layer 160 covers the sidewalls of the trenches and the top surface of the barrier layer 130, wrapping the ridges between the trenches. The dielectric layer 160 in the trenches and wrapping around the ridges 170 is not continuous from the source area to the drain area. As shown in FIG. 1D, the dielectric layer 160 may be completely absent from a portion of the gate recess region 147. The dielectric layer 160 is etched in at least a portion of the trench region 145 to form a gate recess region 147. Thus, the dielectric layer 160 fills at least a portion of the trenches and covers the barrier layer 130 outside of the gate recess region 147.

The gate electrode 142 is formed in the gate recess region 147. The gate electrode 142 may not be as wide as the trench region 145, as is shown in FIG. 1A. The gate electrode 142 is disposed in the trench region 145, over the ridges as shown in FIG. 1A. The gate electrode 142 is made of material selected from Ti, Al, TiN, W, WN, Ni, Au, Pt, ploy-silicon and any other suitable conductive material. Underneath the bottom of the gate electrode 142, the dielectric layer 160 may be absent.

In another embodiment, the dielectric layer 160 may be partially absent from the gate recess region 147. For example, under the bottom of the gate electrode 142, the dielectric layer 160 may be absent at the top of the barrier layer 130 and the upper part of the sidewalls of the ridges 170, but may be disposed at the bottom of the trenches. The amount of dielectric layer 160 remaining at the bottom of the trenches in the gate recess region 147 may depend on how much of the dielectric layer 160 was etched away from the gate recess region 147.

In another embodiment, the dielectric layer 160 has a thinner thickness underneath the gate electrode 142 in the gate recess region 147 than outside the gate electrode 142.

The dielectric layer 160 may or may not completely fill the trenches. The dielectric layer 160 may or may not be conformally deposited on the top surface of the barrier layer 130 and trench sidewalls resulting different thickness on the barrier layer 130 than on the sidewalls. In other words, the dielectric layer 160 may be disposed in the trench in the trench region 145 but may not extend to the top of the ridges 170.

Figure 2A:
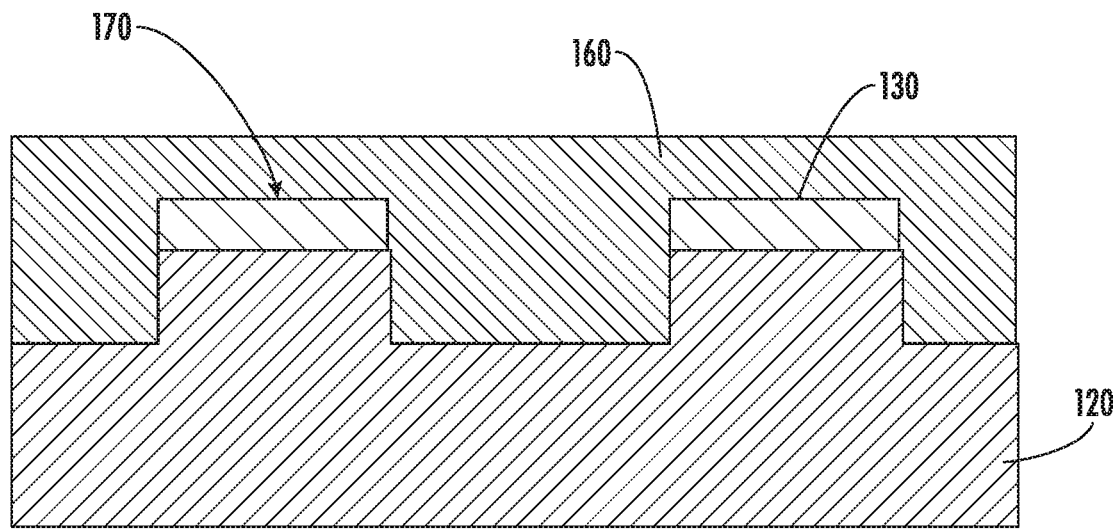
FIG. 2A is a cross-sectional view of the transistor structure of FIG. 1C taken along line A-A'.
Figure 5:
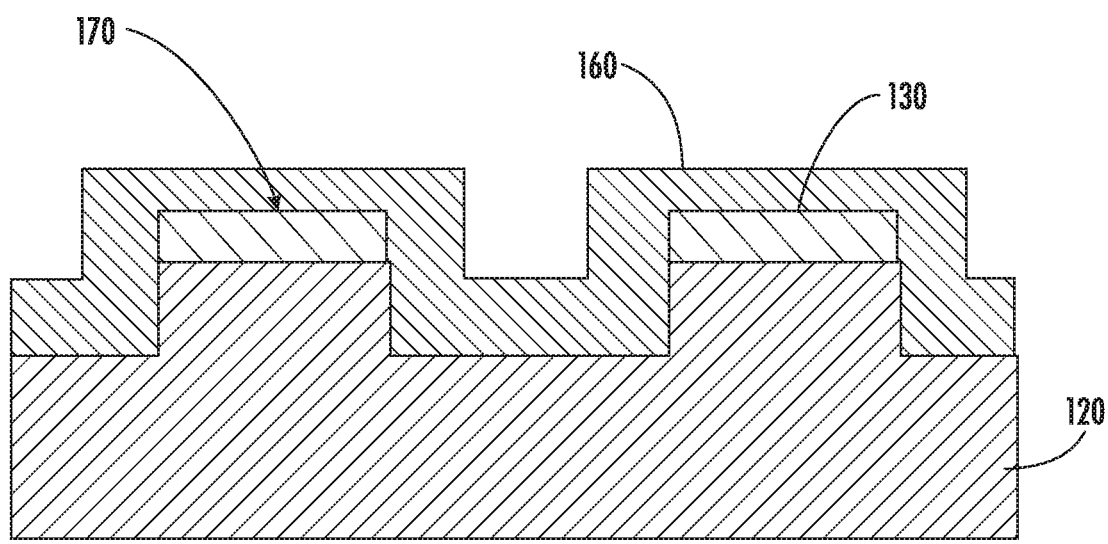
FIG. 5 is another embodiment where the dielectric layer is conformally deposited.

FIGS. 2A-2D show cross-sectional views of the semiconductor structure 100. FIG. 2A shows a cross-section taken through line A-A' (see FIG. 1C). This figure shows the cross-section in the trench region 145 looking toward the drain electrode 141. FIG. 2A shows an example wherein the top surface of the dielectric layer 160 is a roughly uniform height. However, the dielectric layer 160 does not need to be formed so that the top surface is flat. In fact, as shown in FIG. 5, the dielectric layer 160 may be conformally formed over the trenches and ridges 170.

Figure 2B:
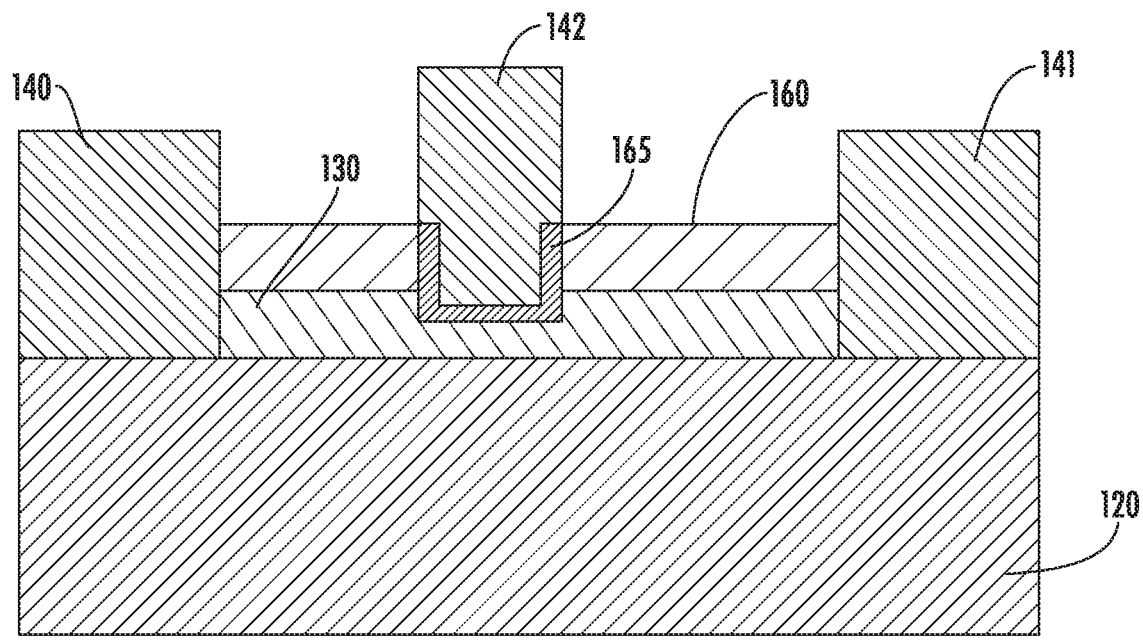
FIG. 2B is a cross-sectional view of the transistor structure of FIG. 1C taken along line B-B'.

FIG. 2B shows a cross-section taken through line B-B' (see FIG. 1C). This figure shows the cross-section in the trench region 145 through one of the ridges 170. As can be seen, the barrier layer 130 extends from the source area to the drain area, with the dielectric layer 160 disposed on top of the barrier layer 130. In this location, the gate electrode 142 is resting on a ridge 170.

Figure 2C:
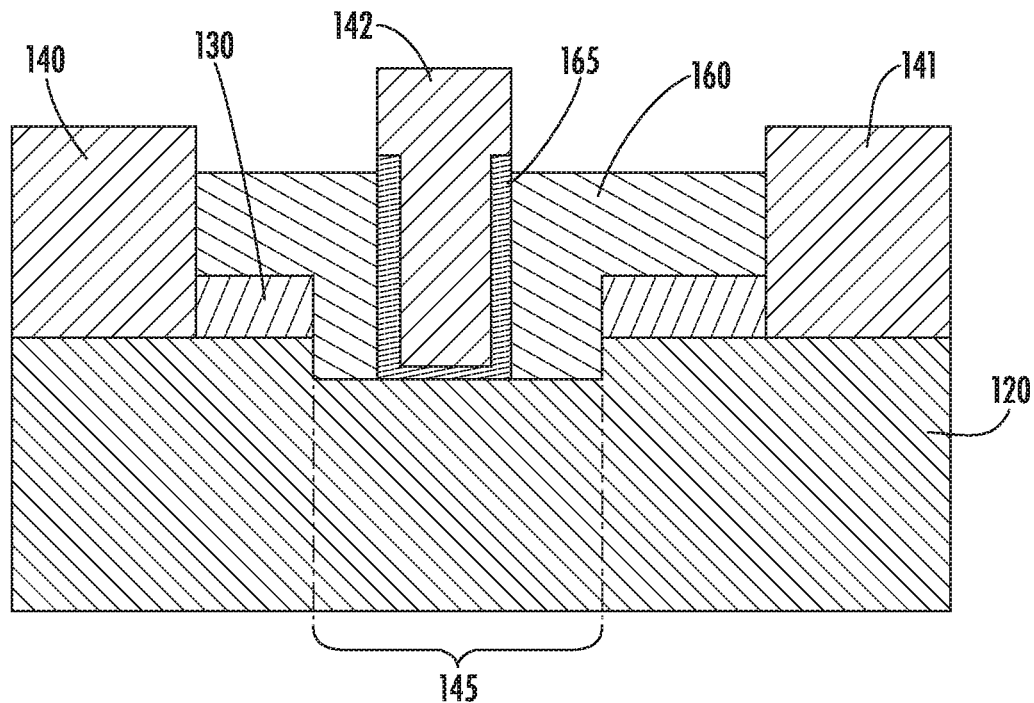
FIG. 2C is a cross-sectional view of the transistor structure of FIG. 1C taken along line C-C'.

FIG. 2C shows a cross-section taken through line C-C' (see FIG. 1C). This figure shows the cross-section in the trench region 145 through one of the trenches. In this area the gate recess region 147 is etched through the barrier layer 130 and into the semiconductor layer 120. The gate electrode 142 in this location extends from the semiconductor layer 120. However, in certain embodiments, a portion of dielectric layer 160 may remain in the gate recess region 147 after the etching. In these embodiments, the gate electrode 142 extends upward from the top of the remaining portion of the dielectric layer 160.

Figure 2D:
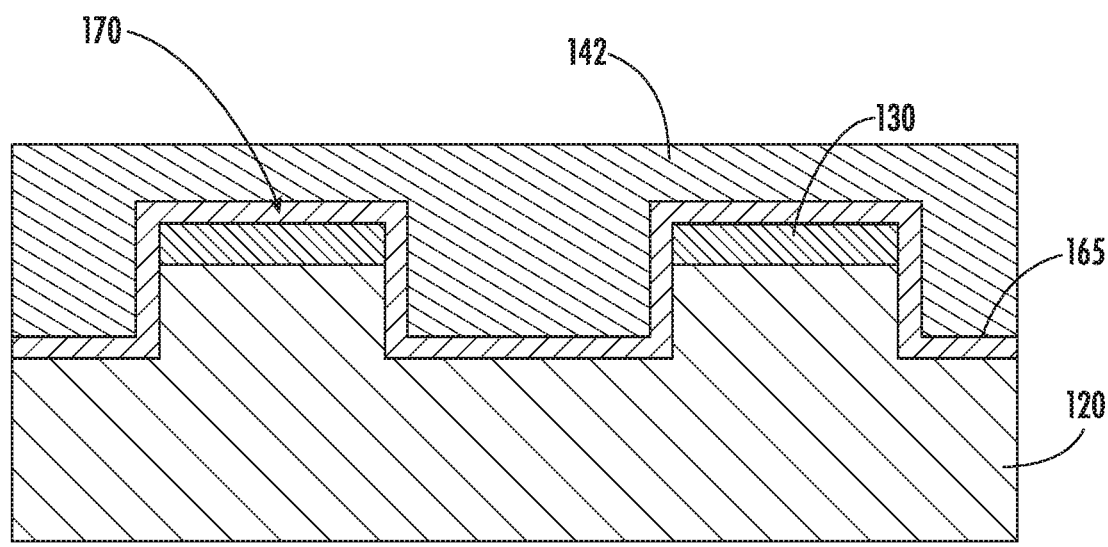
FIG. 2D is a cross-sectional view of the transistor structure of FIG. 1C taken along line D-D'.

FIG. 2D shows a cross-section taken through line D-D' (see FIG. 1C). This figure shows the cross-section in the trench region 145 through the gate electrode 142. In this area, the bottom of the gate electrode 142 has stepped portions to accommodate and wrap around the ridges 170. In certain embodiments, a gate dielectric layer 165 is disposed between the gate electrode 142 and the rest of the semiconductor structure 100.

Although not shown in the figures, the top of the gate electrode 142 may not be flat. Rather, the metal for the gate electrode 142 may be conformally deposited, such that the top surface of the gate electrode 142 is not flat. In these embodiments, the gate electrode 142 will extend upward further over the ridges 170 than over the trenches.

In certain embodiments, such as that shown in FIGS. 2B-2C, the top of the gate electrode 142 may be larger than the bottom of the gate electrode 142. The top of the gate electrode 142 may or may not be larger than the length of the trench region 145 along the source to drain direction. For example, the upper portion of the gate electrode 142 may cover the entirety of the trench region 145 and rest on top of the dielectric layer 160 near the source and drain areas. Thus, the gate electrode 142 may be T-shaped or inverted L-shaped, where the central portion extends downward into the gate recess region 147, and the upper portions extend outward toward the source electrode 140 and/or the drain electrode 141 and cover a portion of the trench region 145. In another embodiment, which is shown in FIGS. 1A-1D, the top of the gate electrode 142 does not completely cover the trenches and ridges in the trench region 145 between the gate and drain.

In certain embodiments, a gate dielectric layer 165 may be formed underneath the gate electrode 142, as shown in FIGS. 2B-2C. The gate dielectric layer 165 is made of materials selected from $Si_xN_y$, $SiO_2$, $SiO_xN_y$, $Al_2O_3$ and any other insulating material. The material used for the gate dielectric layer 165 may be the same or different from the material used for the dielectric layer 160. The thickness of the gate dielectric layer 165 may, in many cases, be thinner than the dielectric layer 160. In one embodiment, the barrier layer 130 on the ridge 170 directly underneath the gate electrode 142 is recessed, as shown in FIG. 2B. The depth of the gate recess in the barrier layer 130 may be smaller than the thickness of the barrier layer 130 or larger than the thickness of the barrier layer 130.

In another embodiment where the barrier layer 130 has sub-layers, such as an AlGaN sub-layer 131 over the semiconductor layer 120, an AlN etch-stop sub-layer 132 over the AlGaN sub-layer 131 and a cap layer 133 over the AlN sub-layer 132, bottom of the gate recess may be at the surface of the AlN sub-layer 132 or the AlGaN sub-layer 131.

Further, while FIGS. 2B-2C show the gate dielectric layer 165 disposed under an entirety of the gate electrode 142, in other embodiments, the gate dielectric layer 165 is disposed only under a portion of the gate electrode 142. In these embodiments, the bottom of the gate electrode 142 may be stepped on its bottom surface to accommodate and wrap around the ridges 170.

The transistor shown in this figure may be either normally-on transistor with carriers such as electrons in the semiconductor layer 120 underneath the gate connecting the source electrode 140 and drain electrode 141 when the gate electrode 142 is not biased, or normally-off transistor with the carriers such as electrons absent from the semiconductor layer 120 underneath the gate when the gate electrode 142 is not biased.

The structure shown in FIG. 1A can be applied to many other semiconductor material systems, including Si, GaAs, $Ga_2O_3$, AlN and SiC.

Figure 3:
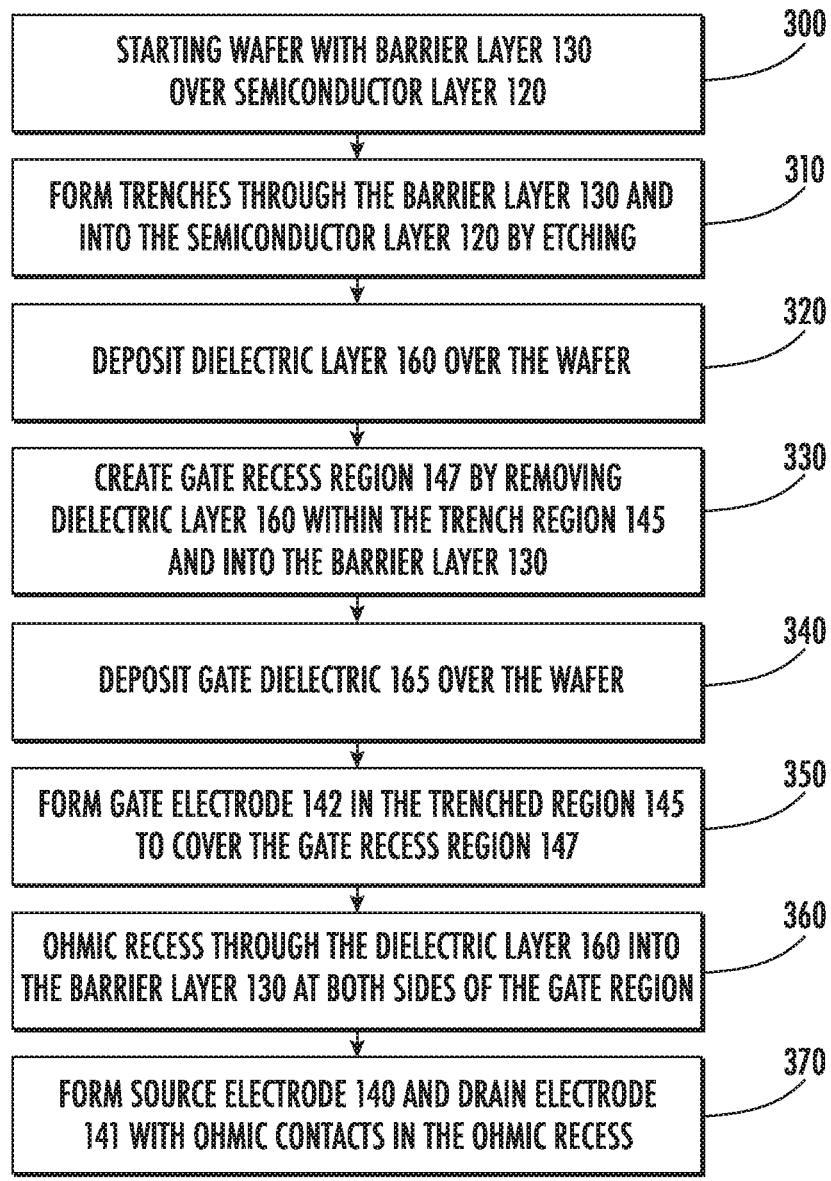
FIG. 3 shows a process that may be used to form the transistor structure of FIG. 1A.

An example of fabricating the transistor structure of FIG. 1A is shown in FIG. 3. First, as shown in Box 300, a wafer is provided. The wafer comprises a substrate 110, a semiconductor layer 120 on top of the substrate and a barrier layer 130 disposed on the semiconductor layer 120. The semiconductor layer 120 and the barrier layer 130 may include various sub-layers, as described above.

Next, as shown in Box 310, trenches are formed in the wafer. This may be done by etching. The trenches may extend through the barrier layer 130 and into the semiconductor layer 120. In other embodiments, the depth of the trenches is less than the thickness of the barrier layer 130 such that the trenches do not extend into the semiconductor layer 120. The creation of the trenches also creates the ridges 170.

Next, as shown in Box 320, the dielectric layer 160 is deposited over the wafer. Thus, the dielectric layer 160 coats the barrier layer 130 in the source area, the drain area and on the ridges 170. The dielectric layer 160 also fills or partially fills the trenches.

Next, as shown in Box 330, material is removed from the gate region to create a gate recess region 147. Specifically, at least some of the dielectric layer 160 is removed from the gate region. In certain embodiments, part of the barrier layer 130 or the semiconductor layer 120 is also removed in the gate region to form the gate recess region 147.

In some embodiments, a gate dielectric layer 165 is deposited over the wafer, as shown in Box 340. This gate dielectric layer 165 will be disposed between the wafer and the gate electrode 142. In other embodiments, this step may be omitted.

Next, the gate electrode 142 is formed to cover the gate recess region 147, as shown in Box 350. Note that the bottom of the gate electrode 142 is not flat. Rather, there are stepped portions on the bottom of the gate electrode 142 to accommodate the ridges 170 that travel under the gate electrode 142. The gate electrode 142 may also be deposited on a portion of the trench region 145, if desired.

Next, as show in Box 360, an ohmic recess in created in the dielectric layer 160 and to or into the barrier layer 130 on both sides of the gate region. Finally, as shown in Box 370, source electrode 140 and drain electrode 141 are formed in these ohmic recesses.

The sequence of forming the gate, the source electrode 140 and drain electrode 141 may be changed. For example, gate electrode 142 may be formed before deposition of dielectric layer 160. Source electrode 140 and drain electrode 141 may be formed before the formation of the trenches, before the deposition of dielectric layer 160, or before formation of gate electrode 142. Additional process steps not shown in FIG. 3 include depositing additional dielectric layers, and forming field plates, vias and interconnections.

Additional passivation dielectric and field plate structures, such as those known in the art may also be applied. Interconnects and more dielectric layers may be applied to connect many smaller transistors together.

Figure 4:
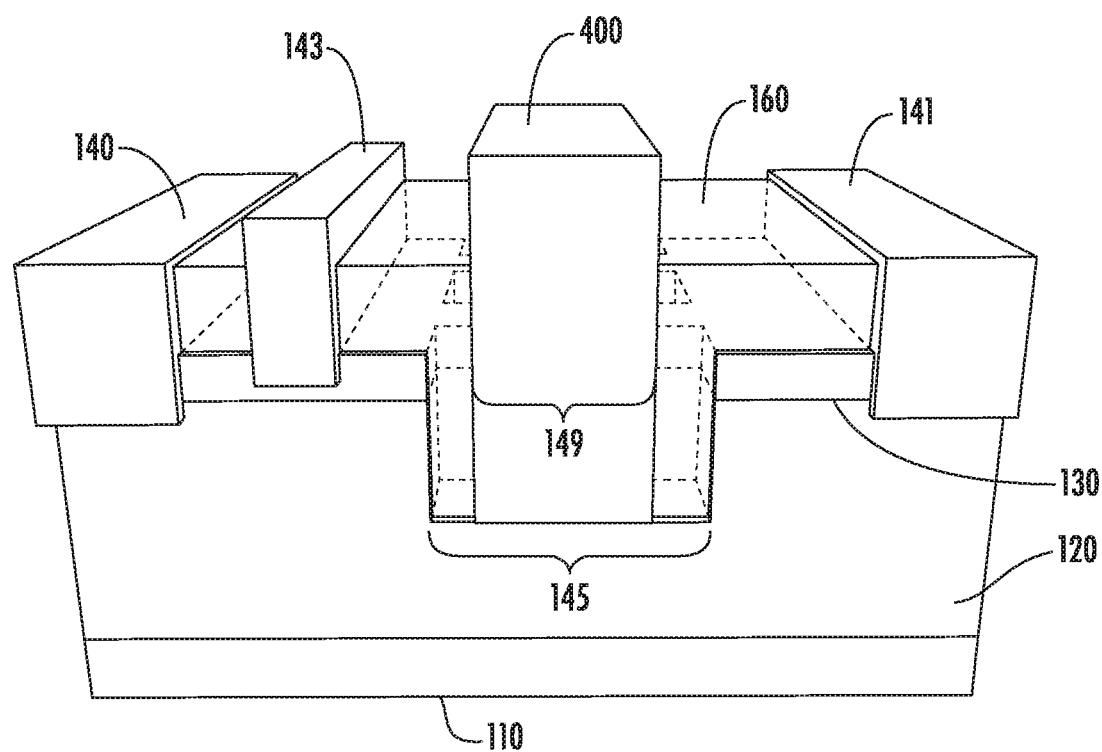
FIG. 4 is a side view of a transistor structure according to another embodiment.

Another embodiment is shown in FIG. 4. The structure of the transistor in FIG. 4 is similar to that shown in FIG. 1A. However, in this embodiment, a field plate 400 is formed in the trench region 145 between the source electrode 140 and the drain electrode 141. In the region where the field plate 400 is to be disposed, at least a portion of the dielectric layer 160 may be removed to form a plate recess region 149. The plate recess region 149 may be narrower than the trench region 145 such that there are trenches on both sides of the plate recess region 149. The compressive or tensile stress may be applied by dielectric layer 160. The field plate 400 covers the ridges 170 as described with respect to the gate electrode for the other embodiments. Thus, the bottom of the field plate comprises stepped portions to accommodate the ridges 170.

In this embodiment, the gate electrode 143 is formed between the source electrode 140 and the field plate 400, and is disposed on or in the barrier layer 130. For example, a portion of the barrier layer 130 may be etched to create a gate recess into which the gate electrode 143 is formed. In certain embodiments, the gate electrode 143 is not in the trench region 145. If the gate electrode 143 is deposited after the dielectric layer 160, the dielectric layer 160 is also etched to create the gate recess.

Field plate 400 may be electrically connected to the source electrode 140, the gate electrode 143 or another terminal. Additionally, the field plate 400 may have a floating potential. Field plate 400 is made of a material selected from metals, polycrystals, nanocrystals, amorphous material and conductive oxides. Additional gate dielectric material (not shown) may be deposited underneath the gate electrode 143. Additional dielectric material may optionally be deposited under the field plate 400.

The thicknesses and composition of the semiconductor layer 120, the barrier layer 130 and the dielectric layer 160 may be as described with respect to the embodiment of FIGS. 1A-1D.

The embodiments described above in the present application may have many advantages. For example, the dielectric layer 160 may be used to increase or decrease the carrier density (electron density) in the ridges 170. The modulation of the carrier density can be used to change the threshold voltage of the transistor. The trenches, together with the dielectric layer 160, reduce the capacitance as compared to a device without the dielectric layer 160 covering part of the ridges and trenches.

The present disclosure is not to be limited in scope by the specific embodiments described herein. Indeed, other various embodiments of and modifications to the present disclosure, in addition to those described herein, will be apparent to those of ordinary skill in the art from the foregoing description and accompanying drawings. Thus, such other embodiments and modifications are intended to fall within the scope of the present disclosure. Furthermore, although the present disclosure has been described herein in the context of a particular implementation in a particular environment for a particular purpose, those of ordinary skill in the art will recognize that its usefulness is not limited thereto and that the present disclosure may be beneficially implemented in any number of environments for any number of purposes. Accordingly, the claims set forth below should be construed in view of the full breadth and spirit of the present disclosure as described herein.

What is claimed is:

1. A semiconductor structure for use in a III-Nitride (III-N) semiconductor device, comprising:
- a semiconductor layer comprising a first III-N material for providing electrical conduction;
- a barrier layer comprising a second III-N material;
- a source electrode and a drain electrode disposed in ohmic recesses in contact with the barrier layer;
- a trench region defined between the source electrode and the drain electrode, wherein trenches are etched into portions of the barrier layer between the source electrode and the drain electrode, wherein ridges are created between the trenches, wherein the ridges comprise the semiconductor layer and the barrier layer and extend from an area near the source electrode to an area near the drain electrode and traverse the trench region;
- a gate recess region defined in the trench region, wherein the gate recess region is narrower than the trench region such that the trenches are disposed on both sides of the gate recess region;
- a dielectric layer, wherein the dielectric layer fills at least a portion of the trenches and covers the barrier layer outside the gate recess region, and wherein a thickness of the dielectric layer in the gate recess region is less than in other areas; and
- a gate electrode disposed in the gate recess region, wherein the gate electrode is formed over the ridges.

2. The semiconductor structure of claim 1, wherein the dielectric layer has compressive or tensile stress.

3. The semiconductor structure of claim 2, wherein the dielectric layer comprises a plurality of sublayers, wherein at least one of the plurality of sublayers has compressive or tensile stress.

4. The semiconductor structure of claim 2, wherein a magnitude of the compressive or tensile stress is greater than 10 MPascal.

5. The semiconductor structure of claim 2, wherein the dielectric layer is selected from $Si_xN_y$, $SiO_2$, $SiON_y$, $Al_2O_3$, and AlN.

6. The semiconductor structure of claim 1, wherein the dielectric layer fills an entirety of the trenches between the ridges outside of the gate recess region.

7. The semiconductor structure of claim 1, wherein the dielectric layer is absent in the gate recess region.

8. The semiconductor structure of claim 1, wherein the gate electrode fills the gate recess region and an upper portion of the gate electrode is wider than the gate recess region.

9. The semiconductor structure of claim 8, wherein the upper portion of the gate electrode is narrower than the trench region.

10. The semiconductor structure of claim 1, further comprising a gate dielectric material disposed beneath the gate electrode.

11. The semiconductor structure of claim 1, wherein a depth of the trenches is greater than a thickness of the barrier layer such that the trenches extend into the semiconductor layer.

12. The semiconductor structure of claim 1, wherein a depth of the trenches is less than a thickness of the barrier layer such that the trenches do not extend into the semiconductor layer.

* * * * *